United States Patent [19]

Penning De Vries

[11] Patent Number: 5,106,781
[45] Date of Patent: Apr. 21, 1992

[54] METHOD OF ESTABLISHING AN INTERCONNECTION LEVEL ON A SEMICONDUCTOR DEVICE HAVING A HIGH INTEGRATION DENSITY

[75] Inventor: René G. M. Penning De Vries, Eindhoven, Netherlands

[73] Assignee: U.S. Philips Corporation, New York, N.Y.

[21] Appl. No.: 611,388

[22] Filed: Nov. 5, 1990

Related U.S. Application Data

[63] Continuation of Ser. No. 376,060, Jul. 5, 1989, abandoned.

[30] Foreign Application Priority Data

Jul. 12, 1988 [FR] France .................. 88 09466

[51] Int. Cl.⁵ ............................................. H01L 21/28
[52] U.S. Cl. ............................ 437/192; 437/194; 437/198; 437/203; 437/190
[58] Field of Search ............... 437/192, 194, 200, 190, 437/189, 197, 198; 148/DIG. 19

[56] References Cited

U.S. PATENT DOCUMENTS

| | | | |
|---|---|---|---|
| 4,624,864 | 11/1986 | Hartmann | 437/193 |
| 4,641,420 | 2/1987 | Lee | 148/DIG. 19 |
| 4,666,737 | 5/1987 | Gimpelson et al. | 437/192 |
| 4,720,908 | 1/1988 | Wills | 437/203 |
| 4,742,014 | 5/1988 | Hooper et al. | 437/203 |
| 4,816,424 | 3/1989 | Watanabe et al. | 437/192 |
| 4,884,123 | 11/1989 | Dixit et al. | 437/194 |

FOREIGN PATENT DOCUMENTS 0202572 11/1986 European Pat. Off. ............ 437/203

Primary Examiner—Brian E. Hearn
Assistant Examiner—Tuan Nguyen
Attorney, Agent, or Firm—Paul R. Miller

[57] ABSTRACT

Method of manufacturing a semiconductor device in which a first conductive, aluminium containing layer (15) is deposited with a low step coverage process over an insulating layer (11) with contact openings (12), in which a second conductive layer (16) is deposited with a high step coverage so as to fill depressed parts of the first conductive layer at the area of the contact openings. The second conductive layer (16) then is substantially eliminated outside the depressed parts and interconnection lines (18) are formed in the first conductive layer. According to the invention the second conductive layer is deposited by D.C. bias sputtering of an aluminium alloy at a substrate temperature which is sufficiently high to obtain a sufficient surface mobility of the deposited alloy. Therefore a planarized layer of the second conductive material (18) is obtained.

15 Claims, 3 Drawing Sheets

METHOD OF ESTABLISHING AN INTERCONNECTION LEVEL ON A SEMICONDUCTOR DEVICE HAVING A HIGH INTEGRATION DENSITY

This is a continuation application of parent application Ser. No. 07/376,060, filed Jul. 5, 1989 now abandoned and all benefits of such earlier application are hereby claimed for this new continuation application.

The present invention relates to a method of manufacturing an integrated semiconductor device having at least one interconnection level making contact connection through narrow contact openings formed in an isolating layer supporting this interconnection level, this method comprising especially a step of depositing a first conductive layer comprising mainly aluminum by a deposition method having a poor step covering ability, a step of depositing a second electrically conducting layer by a deposition method of high step covering ability ensuring that the depressed parts of the first conductive layer are substantially filled at the area of the contact openings, a step of at least substantially eliminating the second conductive layer outside the depressed parts and finally a step of forming interconnection lines by local etching of the conductive material remaining at the surface of the isolating layer.

The semiconductor technology shows a constant evolution in the favour of an increasingly higher integration of the number of elementary components in the same monolithic circuit.

For this purpose and in order to increase the operating speed of the circuits, efforts are made to reduce as far as possible the dimensions of the elementary components. The conventional techniques of forming contact connections on semiconductor devices utilized until recently contact openings and interconnection lines whose lateral dimensions were mostly considerably larger than the thickness of the conductive layer constituting the lines. With regard to the manufacture of circuits having a high integration density, it is on the contrary necessary to form contact openings whose diameter is of the same order as the thickness of the isolating layer in which these contact openings are formed. In this respect, reference is frequently made to the ratio between the depth and the diameter of the contact openings, designated as aspect ratio, which, when this ratio is near or even higher than one, indicates that the known techniques of forming contact connections especially based on the deposition of a single layer of aluminium can no longer be used successfully.

Thus, the method mentioned in the introductory paragraph has been proposed to provide a suitable solution for the formation of an interconnection configuration on a circuit having a high integration density, in which the contact openings have an aspect ratio near or higher than one, in order to fill up the depressed parts of the first conductive layer of aluminium at the area of the contact openings and in order to ensure the electrical continuity at the step formed by the walls of these openings, which are necessarily fairly abrupt.

A method of this kind is known from the document Japanese Patent Application JP-A-60.85514 published on 15/05/1985.

According to the known method, the second conductive layer is obtained by deposition of a tantalum paste, which ensures the filling of the depressed parts of the first layer of aluminium, depressed parts, which are formed at the area of the contact openings. The tantalum paste is cured by thermal treatment, and subsequently the part of the layer thus formed, which is situated outside the cavities, is eliminated.

The known method makes use of specific techniques, at least one of which is rather complex. In fact, the operation utilizing a tantalum paste is not common practice among the techniques of manufacturing semiconductor devices.

This operation requires an accurate adjustment of the composition of the paste and yields results whose perfect reproducibility may be difficult to obtain.

Moreover, it is necessary to carry out a particular thermal treatment to obtain the curing of the fluid deposited layer, which therefore imposes a supplementary step in the method of manufacturing.

Therefore, it would be desirable that a similar technical result can be attained by utilizing more conventional means, which can be more readily controlled and are less onerous.

The invention proposes an improvement of the known method, in which the aforementioned difficulties are met to a great extent. It is based on the idea to utilize as far as possible aluminium or an alloy rich in aluminium as material for the formation of the interconnection configuration, which permits using as subsequent treatments conventional and satisfactorily controllable operations, while limited and specific measures are taken to avoid the disadvantages inherent in the use of aluminium.

For this purpose, according to the present invention, a method as mentioned in the preamble is characterized in that the deposition of the second conductive layer is effected by D.C. bias sputtering of a conducting material comprising mainly aluminium, the substrate being kept at a temperature which is sufficiently high to obtain a sufficient surface mobility of the deposited species.

The technique of depositing aluminium or an aluminium alloy with incorporation of copper and/or of silicon by sputtering with a D.C. bias of the substrate, the latter being kept at a given sufficiently high temperature, permits that the metallic species to be deposited obtain a sufficient mobility (a mean free path) such that a planarization of the deposited layer is obtained as a result of the displacement of these species towards the positions of lower energy.

This therefore results in that the depressed parts left during the deposition of the first conductive layer of aluminium alloy are filled.

The technique of deposition by sputtering providing a high mobility of the species to be deposited is known as such, for example from the document European Patent Application EP-A-0 257 277.

It is also known to those skilled in the art that the layers of aluminium or aluminium alloy obtained by this technique have a resistance to electromigration which is much lower than that of the layers of the same composition which are obtained by the other more conventional techniques, such as the normal argon sputtering without D.C. bias and at a temperature near the ambient temperature. For this reason, the method utilizing a single metallic deposition by high mobility sputtering such as proposed in the document EP-A-0 257 277 already mentioned, seems hardly applicable, especially for very narrow interconnection lines, in view of the expected lifetime problems of the devices thus obtained. With respect to very large scale integrated circuits, the reliability problem arises to an even larger extent.

On the contrary, the method according to the invention has the advantage of providing a high resistance to electromigration due to the fact that the interconnection lines are constituted at least essentially by the material of the first conductive layer, which has a high resistance to electromigration. The material of the second conductive layer is used mainly to recover the flatness of the surface of the interconnection structure and only as complement of electrical conduction at very localized areas, i.e. in the contact openings. By comparison with the use of the first conductive layer alone, the resistance to electromigration is improved at these localized areas.

The method according to the invention can be effected in a very simple manner in the cases of application in which the contact connection is compatible with the presence of aluminium, especially for the formation of an interconnection level higher than the first level, while the underlying level has, at least at the surface, a layer in which aluminium is the main constituent.

The deposition of the first layer and the deposition of the second conductive layer can be carried out one after the other in the same equipment, the operating conditions being only modified when passing from one layer to the other.

In another embodiment of the invention in the case in which the interconnection level is a first level and the contact connection is effected on contact zones of the device, the method is characterized in that, before forming the first conductive layer, a comparatively thin metallurgic contact layer is first deposited by a method ensuring a good step coverage.

Advantageously, the metallurgic contact layer is a layer of titanium-tungsten alloy (Ti-W) deposited by sputtering.

The term "comparatively thin layer" is to be understood to mean a layer whose thickness is a small fraction of the smallest lateral dimension of the contact openings so that the metallurgic contact layer serves as a barrier avoiding any interaction between the aluminium and the semiconductor body, but does not ensure the filling of the cavities formed by the contact openings. The Ti-W alloy is one of the actually preferred materials for this use. It has excellent properties of adherence to different materials simultaneously present, especially: silicon, a dielectric, such as $SiO_2$, $Si_3N_4$, silicide of a refractory metal, etc., and it participates for a non-negligible part in the electrical conduction of the interconnection configuration, it substantially reduces the degradations due to the thermomigration.

The method according to the invention can be carried out in that, after the second conductive layer has been deposited, the latter is removed practically throughout its nominal thickness, i.e. the thickness of this layer as it is observed on top of the flat parts of the first aluminium layer, outside the contact openings.

In this case, a particular embodiment of the invention is characterized in that, before forming the second conductive layer, an intermediate conductive layer is deposited on top of the first conductive layer, which intermediate layer serves as an etching stopper during the step of eliminating the second conductive layer, and in that this intermediate layer is maintained at the surface of the interconnection lines.

In practice, the intermediate conductive layer is advantageously a layer of titanium-tungsten alloy. Thus, it is ensured that the end of the step of etching the second conductive layer can be very readily determined, and the risk of hillocks formation in the first conductive layer is reduced.

Thus far it has been indicated that the second conductive layer was eliminated practically throughout its nominal thickness. However, this is not indispensable at all. In fact, according to an alternative of the method according to the invention, on the contrary, the second conductive layer is eliminated only over part of its thickness, the nominal thickness of the first conductive layer plus the nominal thickness of the remaining part of the second conductive layer being chosen at a value lying between 0.5 and 1.3 $\mu$m.

In order that the invention may be readily carried out, it will now be described more fully, by way of example, with reference to the accompanying drawings, in which.

Figure 7:
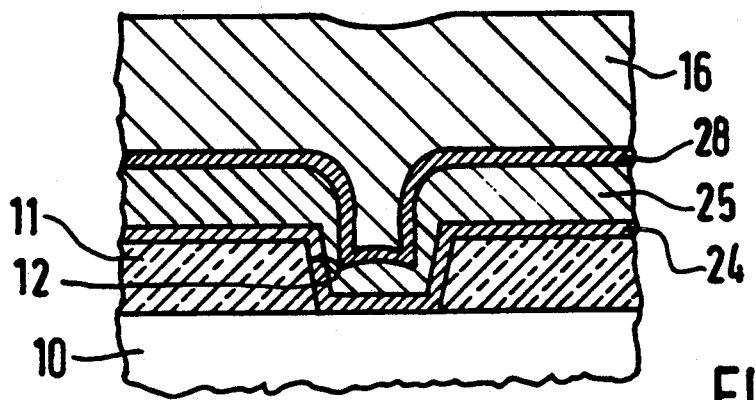
Figure 8:
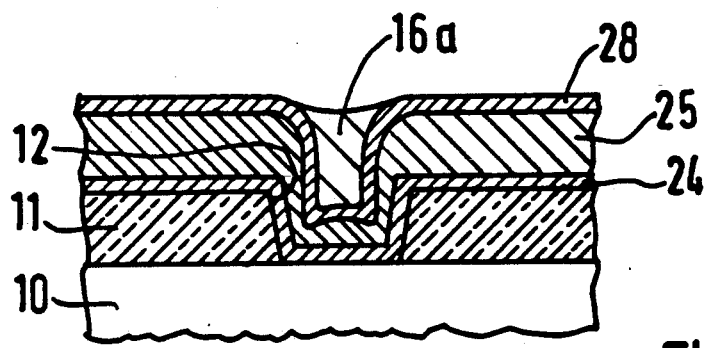
Figure 9:
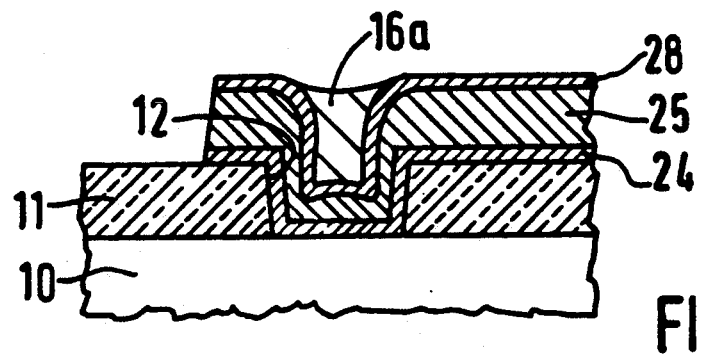

FIGS. 7, 8 and 9 also indicate sectional views for steps of the method according to the invention in another embodiment.

It should be noted that in the figures shown the elements are not drawn to scale for the sake of clarity.

Figure 1:
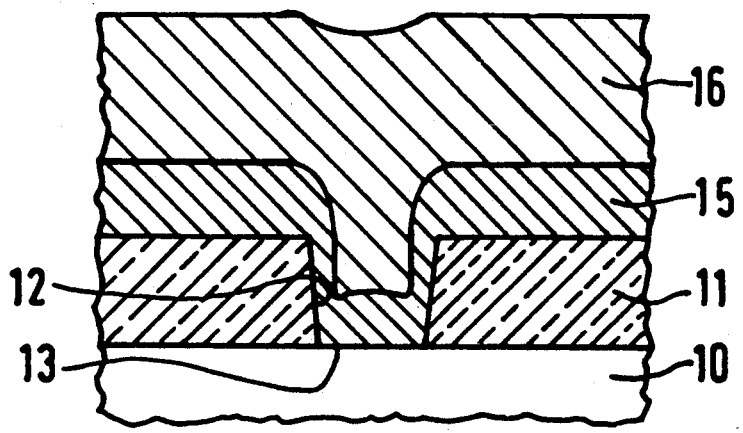
FIGS. 1, 2, 3 and 4 show diagrammatic partial sectional views of a semiconductor device during different steps of the method according to the invention in a first embodiment.

FIG. 1 shows a first embodiment of the invention. On a or substrate layer 10 of the semiconductor device has been deposited an isolating layer 11, which may consist, for example, of silica glass, which may be doped with phosphorus or boron.

The superficial layer 10 may be the surface of the semiconductor body itself or may be an arbitrary metallization level, above which efforts are made to establish a further level of metallization. In the isolating layer 11 are formed contact openings 12, which are comparatively narrow, that is to say that their smallest lateral dimension is of the order of the thickness of the isolating layer 11.

The step of etching the contact openings 12 is carried out by means of conventional techniques of the anisotropic reactive ion etching type so as to obtain openings having rather abrupt sidewalls.

The bottom of the contact openings 12 merges at contact zones 13 provided at the surface of the superficial layer 10 of the semiconductor device.

A first conductive layer 15 comprising mainly aluminium, for example an alloy of aluminium-copper frequently used in the semiconductor technology, is then deposited by means of a conventional technique, for example by conventional sputtering. It is known that this type of technique does not result in a uniform coverage of the walls and of the bottom of the contact openings 12. Therefore, such a thickness of the first conductive layer 15 is consequently chosen that the contact openings 12 are not obturated and that this layer does not substantially present a negative slope at the sidewalls of the openings, but presents a sufficient thickness in order that this layer can ensure, at least essentially, the conduction of the interconnection lines, as will be explained in detail hereinafter.

This thickness generally lies between 0.3 and 0.6 $\mu$m.

Subsequently, a second electrically conductive layer 16 is deposited by a deposition method of high step covering ability, which ensures that the depressed parts left by the first conductive layer 15 are substantially filled at the area of the contact openings 12. Therefore, the second conductive layer 16 is deposited with a comparatively large thickness of the order of, for example, 0.8 µm.

According to the invention, the deposition of the second conductive layer 16 is effected by D.C. bias sputtering of pure aluminium or an aluminium rich alloy with the substrate being kept at a temperature sufficiently high to provide a sufficient surface mobility of the deposited species. The operating conditions of this deposition are controlled so that a planarization of the deposited layer is obtained and therefore lead to the filling of the depressed parts of the first conductive layer 15. These operating conditions strongly depend upon the equipment used and are therefore mainly determined by experiments. With regard to the temperature of the substrates during this operation, it is chosen as high as possible to favour the surface mobility of the species deposited, but below the limit for which the aluminium reacts with the other materials present, and then leads to an irreversible deterioration of the device. In practice, the temperature which is preferably used does not exceed 450° C.

In general, the fixation of the detailed empirical conditions of the deposition by high mobility sputtering will be inspired by the publications on this subject and especially by the document EP-A-0 257 277 already mentioned, which is here incorporated by reference.

Figure 2:
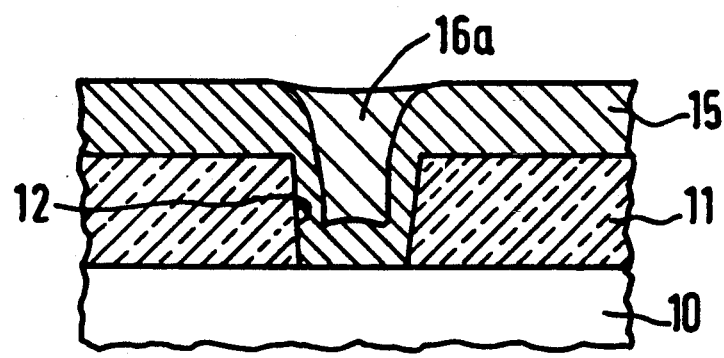

FIG. 2 shows the result of the following operation, which consists in that the second conductive layer 16 is eliminated outside the depressed parts corresponding to the contact openings 12. The elimination of the second conductive layer 16 is preferably effected by means of anisotropic reactive ion etching or in a plasma. The duration of this etching treatment is determined by experiments from the nominal thickness of the second conductive layer 16 and from the etching rate. After this etching treatment, a local element 16a of the second conductive layer remains, which ensures the filling of the cavities at the area of the contact openings 12.

Figure 3:
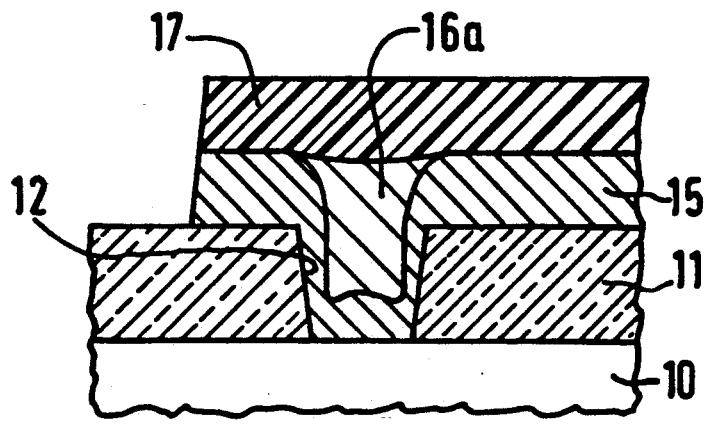

The following operations are illustrated with reference to FIGS. 3 and 4 and they consist in forming the interconnection configuration by using a photoresist mask 17 and a local etching of the first conductive layer 15. Since in this case, etching of a layer of an aluminium alloy is concerned, these operations utilize techniques, which are common practice in the field of semiconductors and need not be described in detail.

Figure 4:
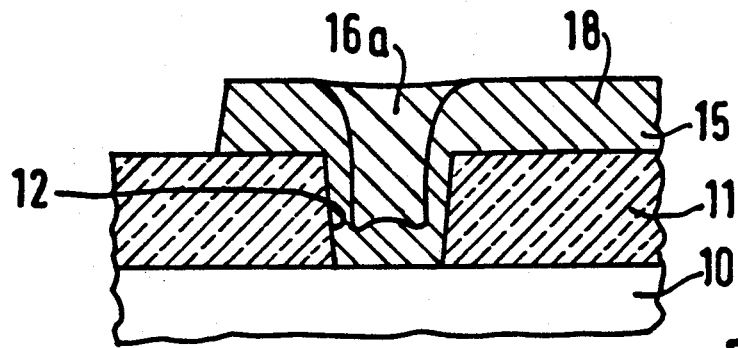

It can be seen from FIG. 4 that the interconnection lines, such as 18, are exclusively formed from the first conductive layer 15 and are therefore constituted by a material suitably resistant to electromigration. The local elements 16a of the second conductive layer constituted by a material less resistant to electromigration are used in a very small portion of the interconnection configuration. They provide a good surface planarity of the metallization and reduce the current density at the contact openings area compared with the current density which would occur in the absence of such local elements 16a.

The semiconductor device is then subjected to finishing operations, which are common practice in technology. If desired, further interconnection levels may be formed, for which it is possible to advantageously use the method according to the invention.

Figure 5:
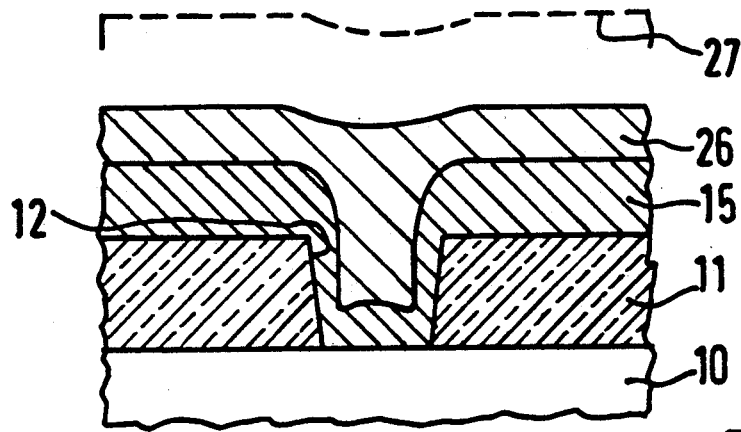
FIGS. 5 and 6 show in the same manner steps in an alternative of this method.

It has been stated before that the second conductive layer 16 was withdrawn throughout its nominal thickness. However, this is not strictly necessary, but on the contrary, as shown in FIG. 5, this layer can be etched only partly. In this figure, the dotted line 27 represents the outer original surface of the second conductive layer, while the part maintained after the partial etching is indicated by the reference numeral 26.

Figure 6:
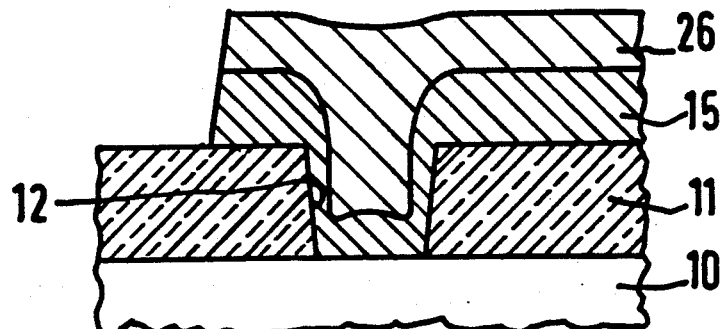

FIG. 6 shows the device at a subsequent stage of this method when the interconnection configuration is realized after masking and local etching of both conductive layers 15 and 26. This alternative of the method according to the invention does not introduce any complication into the operation because it requires only a variation of the etching duration of the second conductive layer 16. It permits reducing to an appreciable extent the electrical resistance 63 the interconnection lines by introducing in a part a material having a lower resistance to electromigration. 63wever, due to the fact that the current density is reduced at the same time in the interconnection nework, the final result is a reduction of the resistances of the lines without appreciable degradation of the reliability of the device. The thikness of the maintained part 26 of the second conductive layer is chosen by experiments while taking into account the specific application and especially the current densities used in the device.

In general, this thickness is chosen so that the nominal thickness of the first conductive layer 15 plus the nominal thickness of the remaining part 26 of the second conductive layer has a value lying between 0.5 and 1.3 µm.

The method described thus far, when used to constitute a first interconnection level with contact connections with contact zones of the device itself, may advantageously be modified in the following manner.

Before forming the first conductive layer 15 of aluminium or of an alloy of aluminium, first a comparatively thin metallurgic contact layer is desposited by using a method ensuring a high step covering ability. A particulary suitable choice consists in utilizing a layer of titanium-tungsten alloy deposited by sputtering. This metallurgic contact layer serves as a barrier preventing any interaction between the aluminium layer deposited at the next stage of the method and the semiconductor body. It does not ensure the filling of the cavities formed by the contact openings 12, but participates to a certain extent in the conduction of the interconnection system. It allows also to decrease the contact resistance with the semiconductor body, it avoids surface pitting of the semiconductor by aluminium and reduces also the hillocks formation in the first conductive layer.

After the deposition of the metallurgic contact layer, the following steps of the method described before with reference to FIGS. 1 to 6 remains practically unchanged. Thus, the description with reference to these Figures futher applies to the present embodiment considering that the first conductive layer 15 is a double layer of Ti-W/Al-Cu. Of course, the operation consisting in cutting the interconnection configuration by local etching is now effected in two successive stages, i.e. a specific step of etching the part of the first conductive layer consisting of aluminium alloy and the other specific step of etching the layer part consisting of titanium-tungsten alloy. In practice, these two etching steps can be realized successively in the same reactive ion etching equipment with only an interruption of the process to modify the etching conditions and especially the gaseous species introduced into the plasma.

Now another embodiment of the method according to the invention will be described with reference to FIGS. 7 to 9. Referring to FIG. 7, the superficial layer 10 of the semiconductor device is covered with an isolating layer 11, in which comparatively narrow contact openings 12 have been formed. Subsequently, a fairly thin metallurgic contact layer 24 is deposited, which consists preferably, but not exclusively, of Ti-W alloy, after which a first conductive layer 25 of aluminium alloy is deposited, all this in the same manner as in the description given above. An intermediate conductive layer 28 is then deposited above which serves as an etching stopper during the step of eliminating the further second conductive layer 16, this layer 28 being perferably made of Ti-W deposited by sputtering. The intermediate conductive layer 28 has a small thickness, preferably lying between 50 and 150 nm. The thickness of the assembly of the layers 24, 25 and 28 is also sufficiently small so that it does not fill entirely the cavities formed at the area of the contact openings 12. Subsequently, the second conductive layer 16 of Al-Cu alloy is deposited by the method of high mobility sputtering using a D.C. biasing of the substrate as indicated above. The second conductive layer 16 is sufficiently thick to realize the filling of the cavities formed at the area of the contact openings 12 and to obtain an approximate planarization of its upper surface. It should be noted that in this embodiment the method comprises a larger number of deposition steps, but nevertheless the homogeneity of the techniques used only requires similar equipment, or even a unique equipment.

Subsequently, the second conductive layer 16 is totally eliminated but for the local parts 16a situated at the areas of the contact openings 12. In this operation, the intermediate conductive layer 28 as an etching stopper and renders the end of this operation more precise and simpler, which end can be controlled by conventional means, for example by the emission intensity of a particular ray of the plasma.

FIG. 9 shows the interconnection structure after it has been formed by local etching of the combination of the layers 28, 25 and 24. Of course, the etching conditions are each time adapted to the kind of the layers to be eliminated. More particularly the layers forming the Ti-W alloy are eliminated in a plasma of sulphurhexafluoride, while the layer 25 of aluminium alloy is eliminated in a plasma of a gaseous compound of chlorine.

According to this variation of the method, as can be seen in FIG. 9, the intermediate conductive layer 28 is maintained for the formation of the interconnection lines and participates therefore in the condition of these lines. Similarly to the preceding samples, the local part 16a, which has been maintained from the second conductive layer 16, is limited to the filling of the cavity situated at the area of the contact opening 12 and its participation in the current transport remains small. This explains that the interconnections and contact connection system thus obtained shows high performances with respect to electromigration. Another advantage of this method is provided by the presence of the layers 24 and 28 of Ti-W alloy, which reduces appreciably the possibilities of formation of protruding spots (hillocks) in the first conductive layer 25 of aluminium alloy during the thermal treatments carried out subsequently.

The method according to the invention is not limited to the examples described above. More particularly, the Ti-W alloy has been indicated as preferred material for realizing the metallurgic contact layer 24 and for the intermediate conductive layer 28. Other materials may also be used in this case, for example an alloy of tungsten-silicon, titanium, titanium nitride, cobalt or a silicide of refractory metal. For the sake of simplicity, the same material may be used to form the contact metallurgic contact layer and the intermediate conductive layer. However, if desired, different materials may also be used in each of the cases.

A suitable choice of the material of the intermediate conductive layer and of its thickness can also allow reduction of light reflection on the metallic layer when the photoengraving operation of the contact configuration is made.

It is known, indeed, that this reflection induces a lack of masking definition in the vicinity of non-horizontal parts of the metallic layer (step crossing).

With regard to the thickness of the first conductive layer 15, 25 of aluminium alloy, it is practically necessary to prevent that a too negative slope is formed on the sidewalls of the contact openings. It can be conceived that this constitutes an important limitation in the choice of the nominal thickness of this layer and hence the conductivity of the interconnection lines may be restricted in a not very practical manner. In order to obtain the best technological compromise at this point, while utilizing the method according to the invention, which further has the substantial advantages already mentioned, the known operating conditions will be used, which tend to delay the formation of negative slope during the deposition of the first conductive layer, for example by producing a slight positive slope or a rounding-off of the edges of the contact openings, and by chossing the most favourable conditions of depositing this layer.

I claim:

1. A method of manufacturing an integrated semiconductor device comprising the steps of
    (a) forming at least one contact opening through an isolating layer on a substrate, said at least one contact opening having a lateral dimension of the order of the thickness of said isolating layer,
    (b) heating said substrate to a temperature of at most 450° C.,
    (c) depositing a metal contact layer on said isolating layer and within said at least one contact opening, said metal contact layer having a thickness of a fraction of a lateral dimension of said contact opening,
    (d) depositing a first conductive layer of mainly aluminum over said isolating layer and said metal contact layer, said first conductive layer extending into but not completely filling said at least one contact opening,
    (e) depositing a second electrical conductive layer over said first conductive layer by DC bias sputtering conductive material of mainly aluminum onto said first conductive layer, said second conductive layer being deposited to a height above said first conductive layer, and said second conductive layer completely filling said at least one contact opening, wherein said temperature maintains a sufficient surface mobility of said deposited electrically conductive layers,
    (f) thereafter, eliminating said second conductive layer at least in part at areas away from said contact openings, and
    (g) then, forming interconnection lines by local etching of conductive material of at least said first conductive layer remaining on said isolating layer.

2. A method according to claim 1, wherein said step (f) is carried out to completely eliminate said second conductive layer from said first conductive layer except from in said contact opening.

3. A method according to claim 2, wherein before said step (e) an intermediate conductive layer is deposited on said first conductive layer, said intermediate conductive layer serving as an etching stopper during said step (f), and wherein said intermediate conductive layer is maintained on said first conductive layer during said step (g).

4. A method according to claim 3, wherein said intermediate conductive layer is formed of titanium-tungsten alloy.

5. A method accoding to claim 4, wherein said first conductive layer is formed in said step at a thickness ranging between 0.3 and 0.6 $\mu$m.

6. A method according to claim 3, wherein both said metal contact layer and said intermediate conductive layer are formed of titanium-tugsten alloy.

7. A method according to claim 6, wherein said intermediate conductive layer is formed to a thickness ranging between 50 and 150 nm.

8. A method according to claim 6, wherein said metal contact layer, said first conductive layer and said intermediate conductive layer are formed in an assembly of layers having a thickness sufficiently small to not entirely fill said at least one contact opening.

9. A method according to claim 2, wherein said first conductive layer is formed in said step (d) at a thickness ranging between 0.3 and 0.6 $\mu$m.

10. A method according to claim 1, wherein said metal contact layer is formed of titanium-tugsten alloy, said metal contact layer being deposited by sputtering.

11. A method according to claim 1, wherein said step (f) is carried out to leave to thickness of said second conductive layer, and wherein said thickness of said second conductive layer plus a thickness of said first conductive layer add to a value ranging between 0.5 and 1.3 $\mu$m.

12. A method according to claim 11, wherein said first conductive layer is formed in the said step (d) at a thickness ranging between 0.3 and 0.6 $\mu$m.

13. A method according to claim 1, wherein said step (f) is carried out by one of anistoropic reactive ion etching and a plasma.

14. A method according to claim 1, wherein said first conductive layer is formed in said step (d) at a thickness ranging between 0.3 and 0.5 $\mu$m.

15. A method according to claim 1, wherein said step (e) is carried out to planarize said second conductive layer at said height above said first conductive layer.

* * * * *